United States Patent
Wylie et al.

(10) Patent No.: US 8,250,433 B2
(45) Date of Patent: Aug. 21, 2012

(54) ALLOCATION OF SYMBOLS OF AN ERASURE CODE ACROSS A PLURALITY OF DEVICES

(75) Inventors: John Johnson Wylie, San Francisco, CA (US); Kevin M. Greenan, Santa Cruz, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 994 days.

(21) Appl. No.: 12/243,419

(22) Filed: Oct. 1, 2008

(65) Prior Publication Data
US 2010/0083068 A1   Apr. 1, 2010

Related U.S. Application Data

(60) Provisional application No. 61/073,649, filed on Jun. 18, 2008.

(51) Int. Cl.
*H03M 13/00* (2006.01)
(52) U.S. Cl. ...................... 714/758; 714/763
(58) Field of Classification Search .......... 714/758, 714/763
See application file for complete search history.

(56) References Cited

U.S. PATENT DOCUMENTS 6,634,007 B1 * 10/2003 Koetter et al. ............ 714/784
7,925,927 B2 * 4/2011 Wylie et al. ............... 714/25

* cited by examiner

*Primary Examiner* — Guy Lamarre

(57) ABSTRACT

A technique is provided for determining an allocation of the symbols of an erasure code across a plurality of devices. A list of erasure patterns is provided for the erasure code and, based on the list, minimal erasures of minimal weight are identified for the code's symbols. Precedences of the symbols are determined based on the size of the corresponding MEMW. An allocation of the symbols across a plurality of devices is determined based on the precedences.

15 Claims, 9 Drawing Sheets

$\overbrace{(2)(3)(0)(1)(4)(6)(5)(7)}^{O1}$
FIG. 13
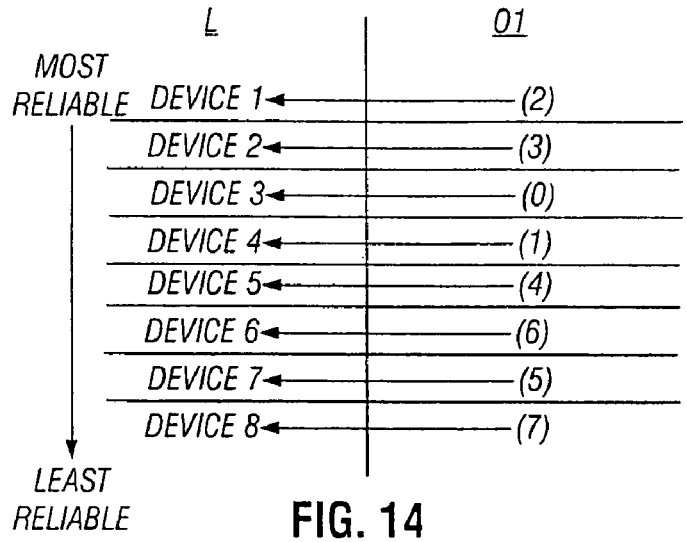
FIG. 14
$\overbrace{(2)(3)(0)(1)(4)(5)(6)(7)}^{O2}$
FIG. 16
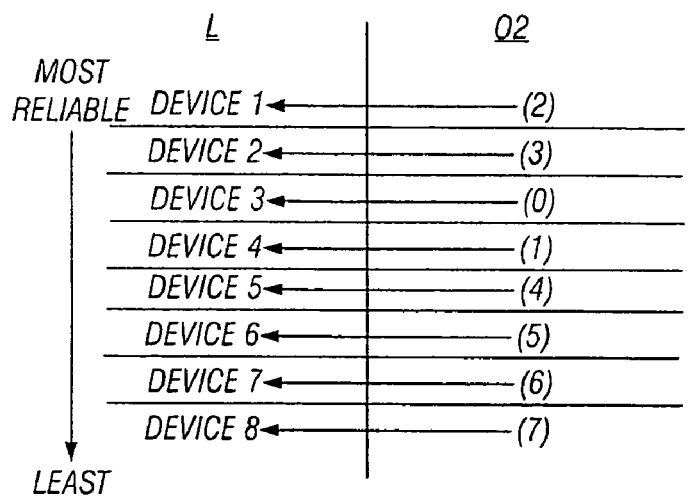
FIG. 17

03
(2)(0)(1)(3)(4)(6)(7)(5)
FIG. 18
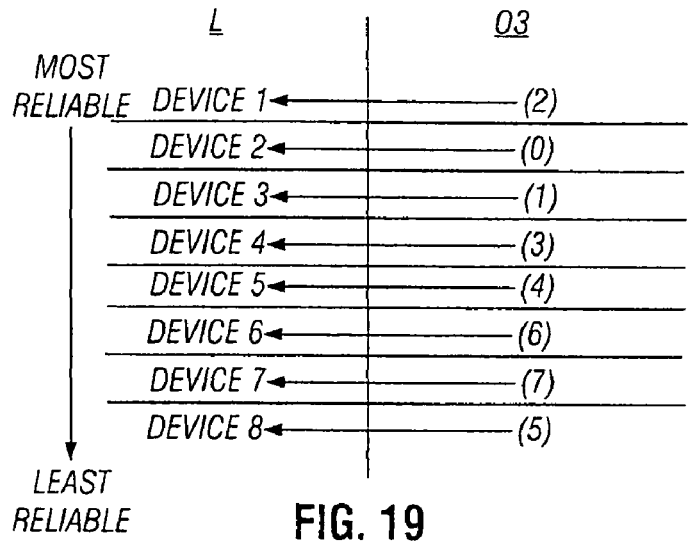
FIG. 19
04
(2)(3)(4)(0)(1)(7)(6)(5)
FIG. 20
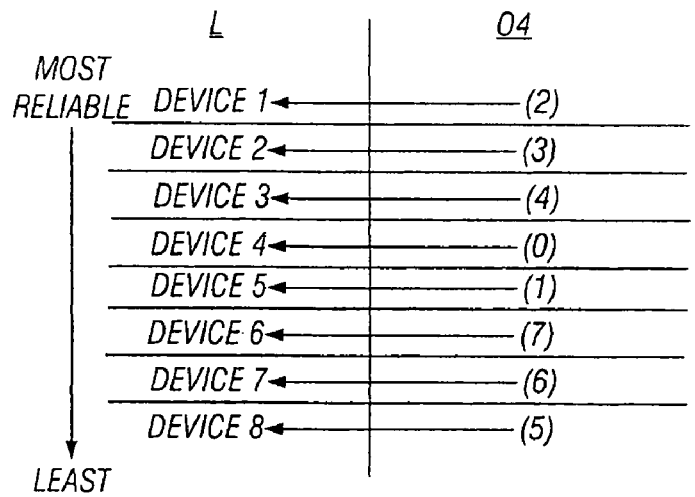
FIG. 21

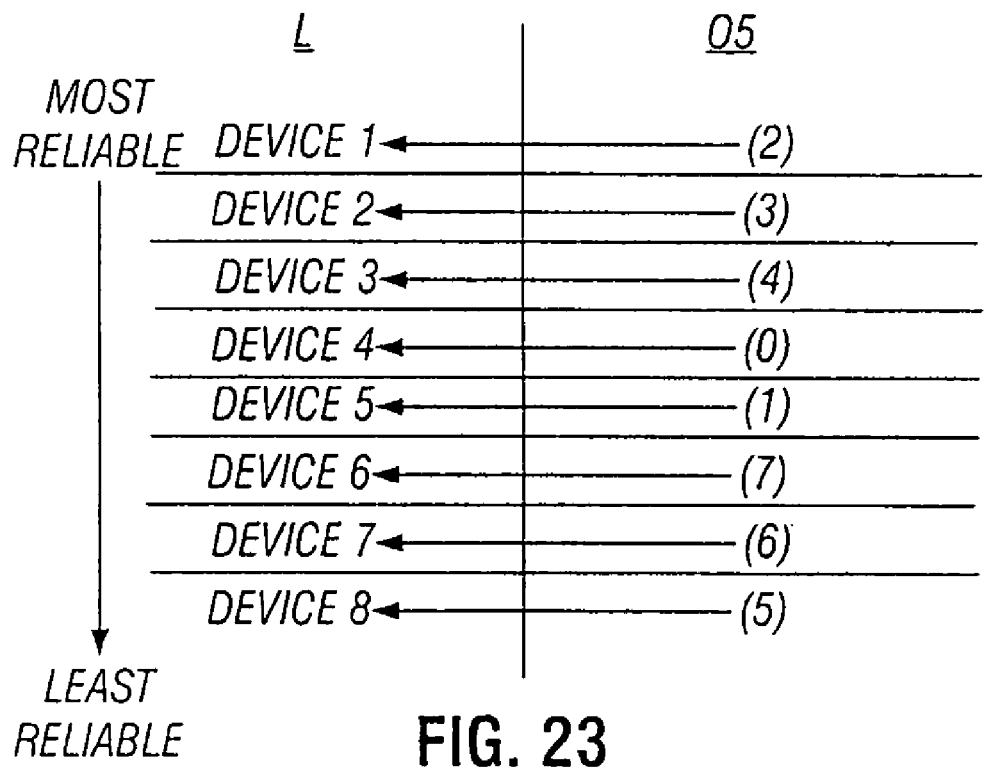

ALLOCATION OF SYMBOLS OF AN ERASURE CODE ACROSS A PLURALITY OF DEVICES

CROSS REFERENCE TO RELATED APPLICATIONS

This Application claims the benefit of U.S. Provisional Application Ser. No. 61/073,649, filed Jun. 18, 2008, titled "Allocation Of Symbols Of An Erasure Code Across A Plurality Of Devices" which is hereby incorporated by reference herein as if reproduced in full below.

BACKGROUND

Network systems and storage devices need to reliably handle and store data and, thus, typically implement some type of scheme for recovering data that has been lost, degraded or otherwise compromised. At the most basic level, one recovery scheme could simply involve creating one or more complete copies or mirrors of the data being transferred or stored. Although such a recovery scheme may be relatively fault tolerant, it is not very efficient with respect to the need to duplicate storage space. Other recovery schemes involve performing a parity check. Thus, for instance, in a storage system having stored data distributed across multiple disks, one disk may be used solely for storing parity bits. While this type of recovery scheme requires less storage space than a mirroring scheme, it is not as fault tolerant, since any two device failures would result in an inability to recover any compromised data.

Thus, various recovery schemes have been developed with the goal of increasing efficiency (in terms of the amount of extra data generated) and fault tolerance (i.e., the extent to which the scheme can recover compromised data). These recovery schemes generally involve the creation of erasure codes that are adapted to generate and embed data redundancies within original data packets, thereby encoding the data packets in a prescribed manner. If such data packets become compromised, as may result from a disk or sector failure, for instance, such redundancies could enable recovery of the compromised data, or at least portions thereof. Various types of erasure codes are known, such as Reed-Solomon codes, RAID variants, array codes (e.g., EVENODD, RDP, etc.), low-density parity check codes (e.g., Tornado codes, Raptor codes, rateless codes, etc.) and XOR-based erasure codes. However, encoding or decoding operations of erasure codes often are computationally demanding, typically rendering their implementation cumbersome in network systems, storage devices, and the like.

In addition, determining the fault tolerance of a particular erasure code, and thus the best manner in which to implement a chosen code can be challenging. For instance, fault tolerance determinations often do not factor in the fault tolerance of the devices themselves, thus leading to imprecision in assessing the actual fault tolerance of the recovery scheme. Thus, efforts to select an optimal erasure code implementation for a particular system could be impeded. Further, uncertainty regarding the fault tolerance of a particular code can impact the manner in which data is allocated among various storage devices and/or communication channels. Such uncertainty could hamper a user's ability to optimally store and/or allocate data across storage devices. Similarly, such uncertainty also could hamper efforts to allocate and route data across communication network channels, inasmuch as those systems could not function as desired.

BRIEF DESCRIPTION OF THE DRAWING

FIG. 13 is a total ordering of symbols induced using the technique of FIG. 12, in accordance with an exemplary embodiment of the invention.

FIG. 14 illustrates an allocation of the ordered symbols of FIG. 13 across a plurality of devices having heterogeneous failure rates, in accordance with an exemplary embodiment of the invention.

FIG. 16 is a total ordering of symbols induced using the technique of FIG. 15, in accordance with an exemplary embodiment of the invention.

FIG. 17 illustrates an allocation of the ordered symbols of FIG. 15 across a plurality of devices having heterogeneous failure rates, in accordance with an exemplary embodiment of the invention.

FIG. 18 is a total ordering of symbols induced using a combination of the technique of FIG. 9 and the technique of FIG. 12, in accordance with an exemplary embodiment of the invention.

FIG. 19 illustrates the allocation of the ordered symbols of FIG. 18 across a plurality of devices having heterogeneous failure rates, according to an exemplary embodiment of the invention.

FIG. 20 is a total ordering of symbols induced using a combination of the technique of FIG. 9 and the technique of FIG. 15, in accordance with an exemplary embodiment of the invention.

FIG. 21 illustrates an allocation of the ordered symbols of FIG. 20 across a plurality of devices having heterogeneous failure rates, in accordance with an exemplary embodiment of the invention.

FIG. 22 is a total ordering of symbols of an erasure code induced by yet another variation of the minimal erasures of minimal weight technique, according to an exemplary embodiment of the invention.

FIG. 23 illustrates the allocation of the ordered symbols of FIG. 22 across a plurality of devices having heterogeneous failure rates, in accordance with an exemplary embodiment of the invention.

FIG. 25 is a partial ordering of symbols of an erasure code induced using the technique of FIG. 24, according to an exemplary embodiment of the invention.

DETAILED DESCRIPTION

Figure 1:
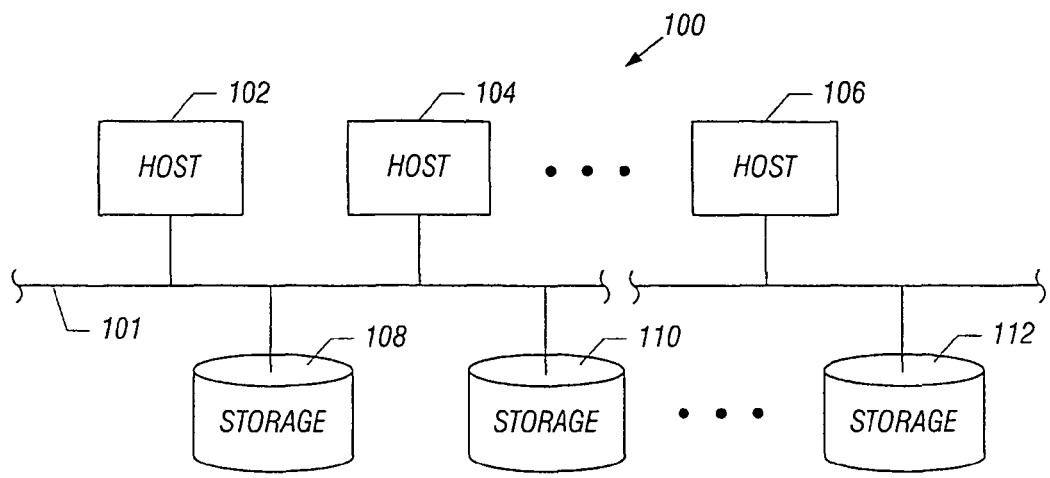
FIG. 1 illustrates a network of devices in accordance with an exemplary embodiment of the invention.

FIG. 1 illustrates an exemplary arrangement of a system of devices 100 which includes a plurality of computer hosts 102, 104, 106 and a plurality of storage devices 108, 110 and 112. In one embodiment, the hosts 102, 104, 106 and storage devices 108, 110 and 112 may be interconnected by a network 101. The network 101 may include, for example, a local area network (LAN), a wide area network (WAN), the Internet or any other type of communication link. In addition, the network 101 may include system buses or other fast interconnects. The system 100 shown in FIG. 1 may be any one of an application server farm, a storage server farm (or storage area network), a web server farm, a switch or router farm, etc. Although three hosts 102, 104, 106 and three storage devices 108, 110 and 112 are depicted in FIG. 1, it is understood that the system 100 may include more than three hosts and three storage devices, depending on the particular application in which the system 100 is employed. The hosts may be, for example, computers (e.g., application servers, storage servers, web servers, etc.), communications modules (e.g., switches, routers, etc.) and other types of machines. Although each of the hosts is depicted in FIG. 1 as being contained within a box, a particular host may be a distributed machine, which has multiple nodes that provide a distributed and parallel processing system.

Each of the devices in the system 100 of FIG. 1 typically may have an associated failure rate (i.e., mean time before failure or MTBF) that is different than the other devices. As will be described below, an exemplary embodiment of the invention provides a method for determining the fault tolerance of erasure codes which, for example, can be used to communicate data between the hosts 102-106 or store data in the storage devices 108-112. By determining the fault tolerance, a measure can be provided for ranking the suitability of employing a particular erasure code with certain communication channels which, for example, are overloaded or are otherwise prone to failure, or for determining an optimal manner for storing the encoded information in the various storage devices 108-112.

The storage devices 108-112 are adapted to store data associated with the hosts 102-106. Each of the hosts 102-106 could be coupled to one or more of the storage devices 108-112, and each of the hosts 102-106 could access the storage devices 108-112 for storing and/or retrieving data from those devices. Each of the storage devices 108-112 could be an independent memory bank. Alternatively, the devices 108-112 could be interconnected, thus forming a large memory bank or a subcomplex of a large memory bank. The devices 108-112 may be, for example, magnetic memory devices, optical memory devices, flash memory devices, etc., depending on the particular implementation of system 100 in which the devices are deployed.

In an exemplary embodiment, a single erasure code can be implemented across the plurality of hosts 102-106 and/or the plurality of storage devices 108-112 to recover data that has become damaged, lost or otherwise compromised during transferring, storing and/or retrieving operations implemented by the hosts 102-106 and/or the storage devices 108-112. The present invention enables users to efficiently determine the fault tolerance of a particular erasure code. Further, the information provided by the fault tolerance determination can be used to optimally correlate fragments of an erasure code (e.g., data and/or parity bits) with reliability levels of the hosts 102-106 and/or storage devices 108-112. Such a correlation may enable the fragments of the erasure code to be allocated across the various devices of the system 100 in a manner that yields a system having a high degree of data recoverability relative to a system in which the erasure code fragments are arbitrarily placed. As an example, data and/or parity bits of the erasure code whose loss are less critical to data recoverability may be allocated to those devices of system 100 having the highest failure rate. As used herein, a fragment of an erasure code that is less critical to data recoverability also can be said to have less weight in the data recovery scheme. Various factors contribute to a particular fragment's weight. For instance, as will be illustrated in further detail below, a fragment that appears in a relatively small number of erasure patterns will have less weight in the data recovery scheme than a fragment that appears in numerous erasure patterns. As another example, a fragment that appears in a smaller size (i.e., fewer symbols) erasure pattern will have more weight than a fragment that appears in a larger size erasure pattern, since the sizes (i.e., the number of symbols) of a code's erasure patterns are indicative of the code's relative fault tolerance. That is, smaller erasure patterns indicate that the code is less fault tolerant than a code with larger size erasure patterns.

Although a single erasure code may be used with each device in the system 100, in some embodiments, each of the hosts 102-106 and/or storage devices 108-112 may use a different or a dedicated erasure code, each of which has its own fault tolerance. By providing techniques for efficiently determining the fault tolerance of an erasure code, the efficient and reliable implementation of data allocation schemes for optimally storing data in each of the devices 108-112 can be accomplished. Moreover, by correlating the fault tolerances of a plurality of erasure codes with the reliability levels of the various devices deployed in the system 100, an allocation scheme could be fashioned whereby the most fault tolerant codes (or fragments of codes) are used with the least reliable devices, thus again enhancing the robustness of the system 100 in terms of data recoverability.

Figure 2:
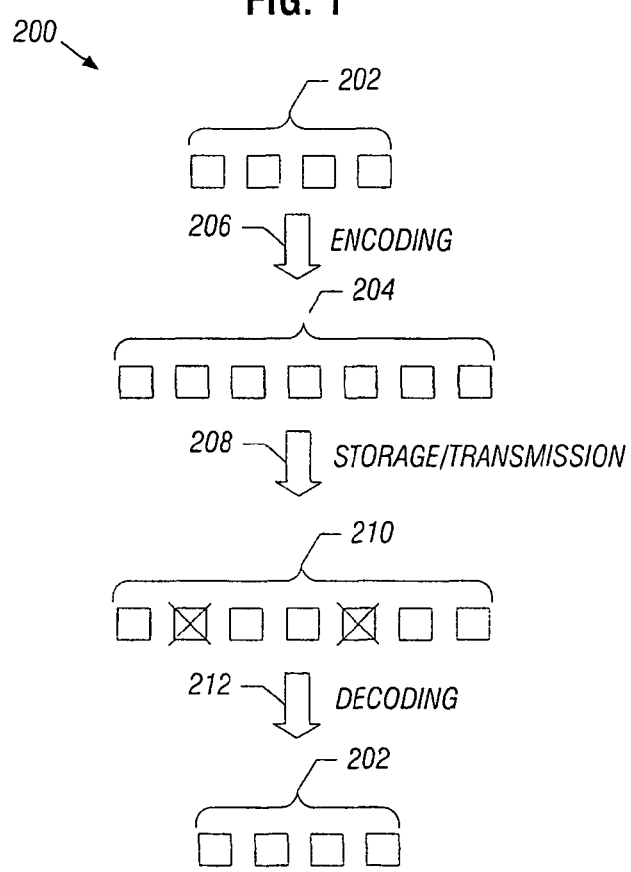
FIG. 2 illustrates encoding and decoding processes implemented by an erasure code in accordance with an exemplary embodiment of the invention.

FIG. 2 illustrates an erasure code encoding and decoding process 200 in accordance with an exemplary embodiment of the invention. The process 200 includes encoding and decoding steps performed by an erasure code for storing, retrieving and/or transferring data in the system 100. In accordance with one embodiment of the invention, the process 200 is implemented by a systematic erasure code, such as an XOR-based code, although other types of systematic erasure codes are contemplated. As illustrated in FIG. 2, an initial data set 202 is provided, which includes a string of bits, bytes, or other symbols representing storable, retrievable and/or transferrable data or other information used by the system 100. The erasure code encodes the initial data set 202 into an encoded data set 204, as represented by the arrow 206. The arrow 206 represents the transformation process, which generally involves creating redundancies within the original data set 202, thereby increasing its size to form the encoded data set 204. The particular transformation process 206 employed is based on the erasure code used and the particular implementation of the system 100.

After encoding, the data set 204 may be stored, retrieved, and/or transferred, as indicated by the arrow 208. For instance, arrow 208 could correspond to transmitting the data set 204 between individual computers or to a user retrieving data from a server. Alternatively, arrow 208 could correspond to data transfer, storage and/or retrieval operations occurring between the multiple communication and/or storage devices of the system 100. During the processes represented by arrow 208, the data set 204 could, for example, propagate through lossy communication channels or be stored in corrupted storage devices. Thus, some portion of the data set 204 could become lost or otherwise compromised, resulting in a degraded data set 210. As illustrated in FIG. 2, the data set 210 includes erasures (represented by the crossed-out portions), corresponding to those portions of the data set 204 which have been lost during the process 208. Depending on the erasure code used and the portions of the data lost, the original data set 202 may be recoverable.

To recover the initial data set 202, a decoding process (represented by arrow 212) is applied to the degraded data set 210. Again, the particular decoding process employed depends on the erasure code being implemented. As the ability to recover the data depends on the erasure code used and which portions of the encoded data set 204 were lost (i.e., the erasures), it may be possible that the initial data set 202 may not be recovered.

As mentioned above, patterns of erasures which lead to irrecoverable data loss relate to the fault tolerance of the erasure code. Systematic erasure codes, such as XOR-based codes, include n symbols, k of which are data symbols, and m of which are parity (or redundant) symbols. A set of erasures f refers to a set of erased symbols, either data symbols or redundant symbols. An erasure pattern is a set of erasures that results in at least one data symbol being irrecoverable (i.e., impossible to recover by any decoding method). An erasures list (EL) for an erasure code is a list of all of the code's erasure patterns. A minimal erasure is an erasure pattern for which every erasure is necessary for it to be an erasure pattern. That is, if any erasure is removed from a minimal erasure, then the minimal erasure is no longer an erasure pattern. A minimal erasures list (MEL) for an erasure code is the list of all of the code's minimal erasures. More compact representations of the EL and the MEL for a particular code are an erasures vector (EV) and a minimal erasures vector (MEV), respectively. An erasures vector EV is a vector of length m in which the ith element corresponds to the total number of erasure patterns of size i in the EL. Likewise, the minimal erasures vector MEV is a vector of length m in which the ith element is the total number of minimal erasure patterns of size i in the MEL. The EV and MEV need only m entries because all erasure sets greater than m in length necessarily are erasure patterns.

In an exemplary embodiment of the invention, analysis of a particular erasure code to determine its erasure patterns is facilitated using a generator matrix and a Tanner graph that correspond to the erasure code. As known in the art, a generator matrix of a (k, m)-code is a k×(k+m) matrix in the Galois field of two elements. Addition of rows and columns in the generator matrix is done modulo 2, that is, in accordance with the XOR operation. The generator matrix consists of a k×k data submatrix and m columns of dimension k×1 appended to the data submatrix as a parity submatrix. Each of the m columns of the data submatrix corresponds to a stored data symbol. Likewise, each of the m columns in the parity submatrix corresponds to a stored parity symbol. A parity column p has a "1" in row i if and only if data symbol $s_i$ is XOR'ed to determine p. For example, if $p=s_2$ XOR $s_4$, the parity column p has a "1" in rows 2 and 4 and a "0" in all other rows. The erasure pattern induced by "1s" in the ith row of the generator matrix is referred to as the ith base erasure.

Figure 3:
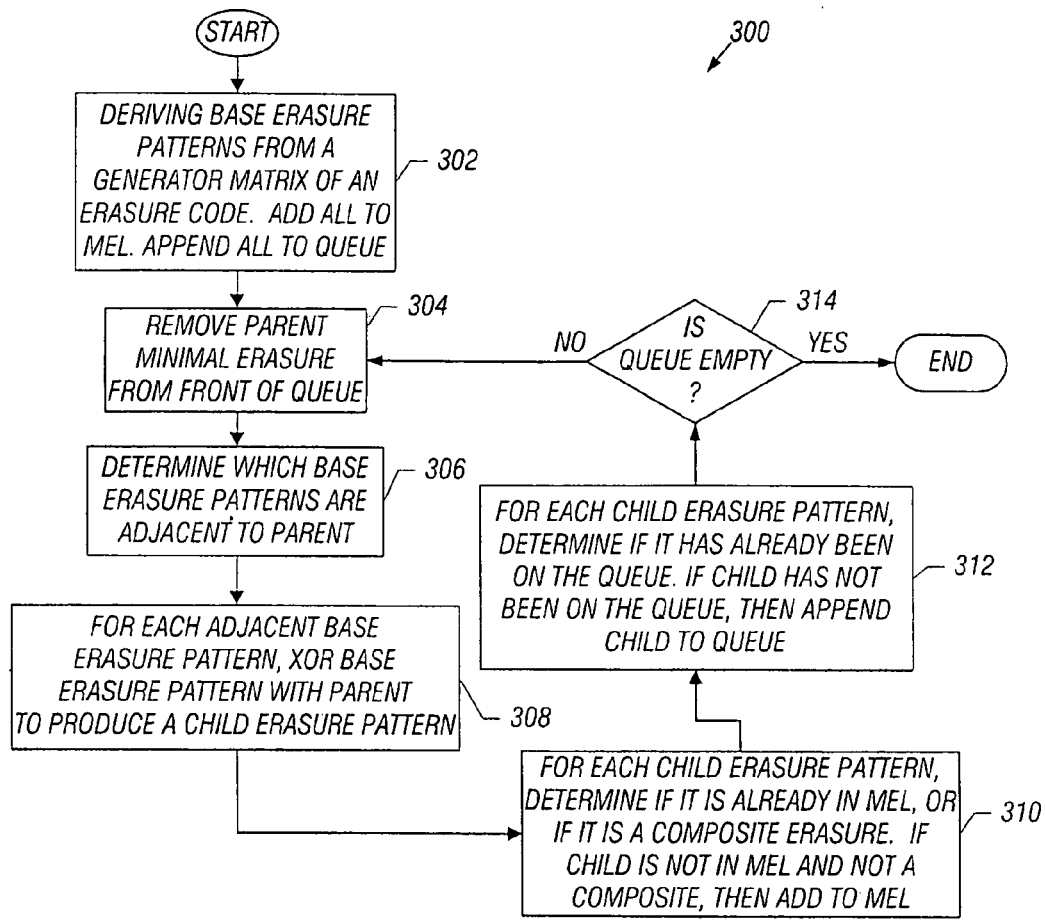
FIG. 3 is a flow diagram of a technique for determining the fault tolerance of an erasure code, in accordance with an exemplary embodiment of the invention.

FIG. 3 is a flowchart illustrating a technique 300 for determining the MEL of an XOR-based erasure code in accordance with an exemplary embodiment of the invention. Hereinafter, the technique 300 will be referred to as the minimal erasures technique. Using the generator matrix for a particular (k,m) erasure code, k base erasure patterns (one for each data symbol) of the erasure codes are derived/identified (block 302). The k base erasure patterns initially form a set of minimal erasures, which are referred to as parent minimal erasures, from which child erasures are further derived. All of the identified base erasures are added to the MEL and are thereafter appended to a queue. Next, at block 304, parent minimal erasures are removed from the queue. At block 306, the process 300 then determines which of the identified base erasure patterns are adjacent. Generally, a data symbol is considered to be adjacent to a minimal erasure if it is connected to a parity symbol in the minimal erasure. Stated otherwise, if two rows of a column of the parity submatrix have an entry of "1," then those two rows are considered adjacent.

Once the adjacent rows of the generator matrix are identified, those rows are XOR'ed with one another to produce child erasure patterns (block 308). Thus, for every minimal erasure found (i.e., for every parent erasure), a child erasure pattern for each adjacent row in the generator matrix is generated. Next, it is determined whether each of the generated child erasure patterns is already in the MEL or whether the child pattern is a composite erasure. Those skilled in the art will appreciate that a child erasure pattern is either a minimal erasure not yet in the MEL, a minimal erasure already in the MEL, or a composite erasure pattern. A composite erasure pattern is the disjoint union of minimal erasures. That is, a composite erasure pattern can be partitioned into minimal erasures. Accordingly, the child erasure patterns that either are not already in the MEL or are not composite erasure patterns are added to the MEL (block 310). Otherwise, a child erasure pattern generated at block 308 is not added to the MEL.

Next, it is determined whether those child erasure patterns that were added to the MEL at block 310 are already on the queue. If not, then the child erasure patterns are appended to the queue (block 312). If the queue on which previously generated erasure patterns were placed is not empty (diamond 314), then the technique 300 terminates. If the queue is not empty, then the process returns to block 304.

One implementation for generating the MEL according to the minimal erasures technique 300 is described in pending patent application Ser. No. 11/904,284, entitled "System and Method for Determining the Fault-Tolerance of an Erasure Code," filed Sep. 26, 2007. As one skilled in the art would recognize, other implementations of technique 300 also are possible. In addition, the technique 300 may be modified such that it determines either the erasures list (EL) or a composite erasures lists (CEL) for a particular erasure code. As discussed previously, the EL is the set of all erasure patterns for the erasure code. The CEL is a list of composite erasures, which are erasure patterns that are either minimal erasures or the disjoint union of minimal erasures. Alternatively, other methods for generating the MEL (or EL or CEL) for erasures codes also are contemplated and within the scope of the invention. While technique 300 may be particularly useful for generating the MEL for an XOR-based code or other codes which exhibit an irregular, non-MDS (maximal distance separable) fault tolerance (i.e., codes which can tolerate some erasures at, and possibly beyond, the Hamming distance), other techniques may be used to generate the MEL for other types of non-MDS erasure codes. One skilled in the art would also recognize that the MEL for any MDS erasure code is simply the list of all sets of symbols of size m+1.

The process 300 for generating an MEL for a particular XOR-based erasure code may be better understood with reference to the generator matrix below of an XOR-based code having k=4 and m=4. One possible generator matrix for such a code could be represented as:

$$\begin{array}{cccccccc} s_1 & s_2 & s_3 & s_4 & p_1 & p_2 & p_3 & p_4 \end{array}$$
$$\begin{bmatrix} 1 & 0 & 0 & 0 & 1 & 0 & 0 & 1 \\ 0 & 1 & 0 & 0 & 1 & 1 & 1 & 1 \\ 0 & 0 & 1 & 0 & 0 & 1 & 1 & 0 \\ 0 & 0 & 0 & 1 & 0 & 0 & 1 & 1 \end{bmatrix} \begin{array}{c} \tilde{f}_{s1} \\ \tilde{f}_{s2} \\ \tilde{f}_{s3} \\ \tilde{f}_{s4} \end{array}$$

Table 1 below summarizes the execution of the technique 300 as applied to the above generator matrix:

TABLE 1

| Q.dequeue | $\hat{f}$ | M |
|---|---|---|
| | $(s_1, p_1, p_4)$ | ✓ |
| | $(s_2, p_1, p_2, p_3, p_4)$ | ✓ |
| | $(s_3, p_2, p_3)$ | ✓ |
| | $(s_4, p_3, p_4)$ | ✓ |
| $(s_1, p_1, p_4)$ | $(s_1, s_2, p_2, p_3)$ | ✓ |
| | $(s_1, s_4, p_1, p_3)$ | ✓ |
| $(s_2, p_1, p_2, p_3, p_4)$ | $(s_1, s_2, p_2, p_3)$ | X |
| | $(s_2, s_3, p_1, p_4)$ | ✓ |
| | $(s_2, s_4, p_1, p_2)$ | ✓ |
| $(s_3, p_2, p_3)$ | $(s_2, s_3, p_1, p_4)$ | X |
| | $(s_3, s_4, p_2, p_4)$ | ✓ |
| $(s_4, p_3, p_4)$ | $(s_1, s_4, p_1, p_3)$ | X |
| | $(s_2, s_4, p_1, p_2)$ | X |
| | $(s_3, s_4, p_2, p_4)$ | X |
| $(s_1, s_2, p_2, p_3)$ | $(s_1, s_2, s_3)$ | ✓ |
| | $(s_1, s_2, s_4, p_2, p_4)$ | ✓ |
| ... | ... | ... |

The first column of Table 1 lists the erasure pattern being processed. The second column lists the children of the corresponding base pattern. The third column indicates (via a checkmark) whether the child erasure pattern is inserted into the MEL and enqueued in the queue. The first four rows of the table illustrate the base erasures determined initially from the generator matrix and placed in the queue. The remaining rows of Table 1 illustrate the children generated by dequeuing the erasure patterns. These rows further indicate which child patterns are inserted into the MEL according to the criteria described above with reference to FIG. 3. The ellipsis at the bottom of Table 1 indicates that the minimal erasures algorithm continues for some number of iterations before terminating.

From Table 1, it can be seen that the MEL for the erasure code characterized by the above generator matrix includes the following minimal erasures: [$(s_1, p_1, p_4)$, $(s_3, p_2, p_3)$, $(s_4, p_3, p_4)$, $(s_1, s_2, s_3)$, $(s_1, s_2, p_2, p_3)$, $(s_2, s_3, p_1, p_4)$, $(s_2, s_4, p_1, p_2)$, $(s_2, s_3, p_1, p_4)$, $(s_3, s_4, p_2, p_4)$]. Accordingly, for the above matrix, any f longer than m=4 is elided from the MEL. Further, an MEV characterizing the MEL is given as (0, 0, 4, 5), signifying that the erasure code has no minimal erasures of size m=1 or m=2; four minimal erasures of size m=3; and five minimal erasures of size m=4.

Figure 4:
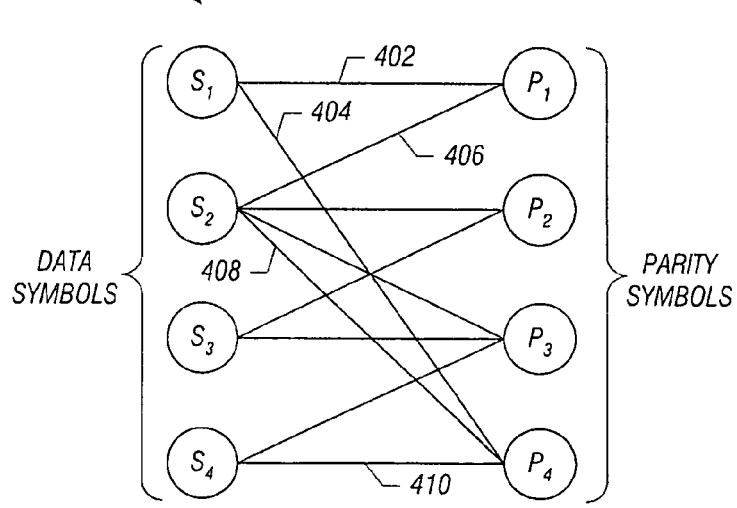
FIG. 4 is a Tanner graph representing an erasure code in accordance with an exemplary embodiment of the invention.

In addition to the generator matrix described above, a Tanner graph also may be generated to facilitate the determination of an MEL for a particular erasure code. A Tanner graph is a bipartite graph with k data symbols on one side, m parity symbols on the other side, and a plurality of edges interconnecting the data symbols and parity symbols in accordance with the structure of the erasure code. A Tanner graph 400 that represents the structure of the erasure code described by the above generator matrix is illustrated in FIG. 4. For instance, for the first minimal erasure pattern corresponding to $(s_1, p_1, p_4)$, edges 402 and 404 connect data node $s_1$ to parity nodes $p_1$ and $p_4$, respectively. The Tanner graph may be used to determine adjacencies of rows of the generator matrix. From the Tanner graph illustrated in FIG. 4, it can be seen that symbols $s_2$ and $s_4$ are adjacent the erasure pattern $(s_1, p_1, p_4)$ since parity node $p_1$ also is connected to data node $s_2$ by edge 406 and parity node $p_4$ also is connected to data node $s_2$ and $s_4$ by edges 408 and 410, respectively. Those skilled in the art will appreciate that additional adjacencies can be derived in a similar manner so as to facilitate computations leading to the erasure patterns set forth in Table 1 from which the MEL for the erasure code is derived.

Once the list of minimal erasures MEL is determined, the MEL may be succinctly expressed as a a minimal erasures vector MEV. Likewise, the list of erasure patterns EL for a particular code also may be expressed as an erasures vector EV. Typically, the EL is a superset of the MEL.

Generally, the EV and the MEV are written as $(j_1 \ldots j_m)$, where $j_i$ is the number of (minimal) erasure patterns of size i. The first non-zero entry, $j_i$, in the MEV and the EV for a particular code are identical and indicate that the code's Hamming distance is i. The Hamming distance of a code is an indicator of the fault tolerance of the code. For instance, for systematic codes, such as XOR-based erasure codes, a Hamming distance of 4 (i.e., the first non-zero entry in the erasures vector is $j_4$) means that there exists some set of four erasures that will result in nonrecoverable data. However, not all sets of four erasures are nonrecoverable. Thus, a systematic code having a Hamming distance of 4 necessarily can tolerate at least three erasures (i.e., erasures of size i−1).

Because the Hamming distance may be determined from the erasure vector, EVs or MEVs can be compared by comparing shortest to longest vector values (i.e., from 1 to m) to determine which code is most fault tolerant. For example, if EV1=(0, 4, 5) and EV2=(0, 0, 10), then the Hamming distance of EV1 is 2 and the Hamming distance of EV2 is 3. Accordingly, since the code corresponding to EV1 can only tolerate at least one erasure and the code corresponding to EV2 can tolerate at least two erasures, then the code corresponding to EV2 is more fault tolerant. As another example, if EV1=(0, 4, 5) and EV3=(0, 4, 4), then both codes have a Hamming distance of 2. The erasure vectors further indicate that both codes have four erasure patterns of size 2. Thus, at this point in the comparison, the fault tolerance of the two codes appears to be equivalent. However, when the third vector values are compared, it can be seen that the code corresponding to EV1 has five erasure patterns of size 3, while the code corresponding to EV3 has only four erasure patterns of size 3. Since EV3 has fewer erasure patterns of size 3, then the code corresponding to EV3 is more fault tolerant than the code corresponding to EV1. MEVs can be compared in a similar fashion. For two codes having the same k and m, comparing the MEVs of the erasure codes is equivalent to comparing those codes' EVs. For two codes that differ in k and/or m, the result of comparing the MEVs of the codes is only necessarily the same as the result of comparing their EVs if those codes have different Hamming distances. The results of the comparison also will be the same if the codes have the same Hamming distance, but have different vector values at the Hamming distance.

The ability to identify the fault tolerance of an erasure code is particularly useful for facilitating placement of the various fragments (i.e., symbols) of the erasure code across various devices in the system 100 which have heterogeneous failure rates. Because the erasure patterns provide an indication of each of the erasure code's symbol's (both data and parity symbols) contribution to the fault tolerance of an erasure code, the MEL (which lists all of the code's minimal erasure patterns) can be used to induce an ordering on the symbols that corresponds to the symbols' respective impact on fault tolerance. The minimal erasures of minimal weight (i.e., those with the fewest number of symbols) determine a code's Hamming distance, and, thus, fault tolerance. Symbols which occur in the minimal weight minimal erasures will have the greatest effect on fault tolerance and, thus, most preferably should be placed on devices that have the lowest failure rate (i.e., the most reliable devices).

As an alternative to inducing an ordering on the symbols of the erasure code to guide placement of the symbols across the devices in the system 100, all possible placements may be simulated or analytically solved. However, for a code with n symbols, such an approach would involve n! simulations or analyses. As n increases, this approach becomes intractable.

Figure 5:
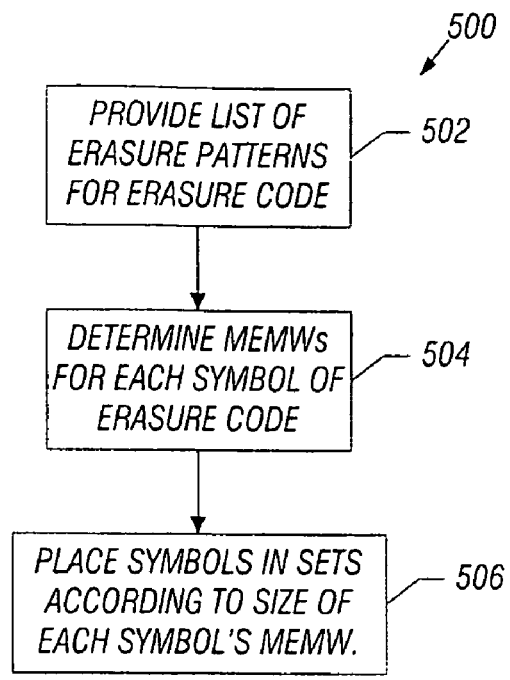
FIG. 5 is a flow diagram of a minimal erasures of minimal weight technique for ordering the symbols of an erasure code in accordance with an exemplary embodiment of the invention.

Thus, in accordance with an embodiment of the invention, a technique is provided for inducing an order on the erasure code's symbols which, together with a list L of devices with known heterogeneous failure rates, is provided to guide placement of the symbols on the devices and thus improve the reliability of the system 100 relative to a random placement of the symbols. An exemplary embodiment of such a technique 500 is illustrated in the flow diagram of FIG. 5. While the technique is described with reference to the MEL generated in accordance with the minimal erasures technique described above, it should be understood that the technique 500 may be based on other lists of erasure patterns which may be generated in other manners. Additionally, the lists of erasure patterns need not be minimal erasures lists, but may be a complete list of erasure patterns (i.e., an EL) or a list of composite erasure patterns (i.e., a CEL), either of which may also be useful for identifying minimal erasures of minimal weight (MEMWs) for the various symbols in an erasure code. A symbol's minimal erasure has minimal weight if it contains the fewest number of symbols as compared to other minimal erasures in which the symbol appears. That is, if a symbol si appears in both a minimal erasure of size two (i.e., an erasure that contains two symbols) and a minimal erasure of size three, the size two minimal erasure is the MEMW for symbol $s_i$.

Figure 6:
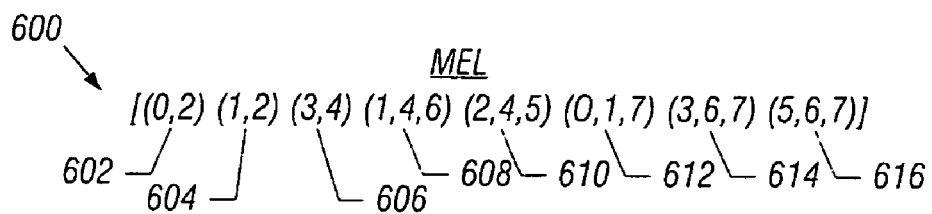
FIG. 6 is a minimal erasures list representing the minimal erasure patterns of an erasure code, in accordance with an exemplary embodiment of the invention.

The MEMW technique 500 is used to induce an ordering on the symbols which comprise a particular erasure code based on the symbols' MEMWs. Generally, the induced order may be either a partial order P or a total order O, depending on the particular implementation of or extensions to the MEMW technique 500. In accordance with the technique 500, and with reference to FIG. 5, a minimal erasures list (MEL) is provided for a particular erasure code by using, for instance, the minimal erasures technique 300 illustrated in FIG. 3 (block 502). An example of an MEL 600 is provided in FIG. 6. As can be seen in FIG. 6, the MEL 602 includes eight minimal erasures and eight symbols (i.e., 0-7). The MEL 602 includes three minimal erasures of size two 602, 604 and 606; and five minimal erasures of size three 608, 610, 612, 614, and 616. The minimal erasure of minimal weight for each symbol can be determined from the MEL (block 504). In this example, symbol "0" has one MEMW of size two (i.e., erasure 602); symbol "1" has one MEMW of size two (i.e., erasure 604); symbol "2" has two MEMWs of size two (i.e., erasures 602 and 604); symbol "3" has one MEMW of size two (i.e., erasure 606); and symbol "4" has one MEMW of size two (i.e., erasure 606). The remaining symbols, "5," "6," and "7," all have MEMWs of size three, where symbol "5" appears in two size three MEMWs 610 and 616; symbol "6" appears in three size three MEMWs 608, 614, and 616; and symbol "7" appears in three size three MEMWs 612, 614, and 616.

In accordance with the MEMW technique 500, a partial order P is induced on the eight symbols of the erasure code by ordering the symbols based on the sizes of the MEMWs (block 506). Symbols that appear in erasure patterns having the fewest number of symbols will have a greater influence on overall reliability than symbols not encountered in the smallest erasure patterns. Thus, symbols which appear in the shortest MEMWs will be placed first in the order. The next longest MEMWs for the remaining symbols will then be examined to determine those symbols' placements in the order.

Referring to the MEL 600, there are three MEMWs 602, 604, and 606. Symbols "0," "1," "2," "3," and "4" all appear in at least one of these MEMWs and thus will be accorded the highest precedence in the ordering scheme in accordance with the MEMW technique 500. The precedence of a symbol refers to the symbol's influence on the reliability of the system 100. The more influence a symbol has, the higher its precedence. The MEMWs for each of the remaining symbols (5, 6, 7) is of size three. Accordingly, symbols (5, 6, 7) may be deemed to have the same precedence, but have less influence than symbols (0, 1, 2, 3, 4) on overall system reliability. Thus, in accordance with one implementation of the MEMW technique 500, the symbols may be placed in the partial order P1 shown in FIG. 7. Partial order P1 includes set 620 with symbols (0, 1, 2, 3, 4) and set 622 which includes symbols (5, 6, 7).

Figure 8:
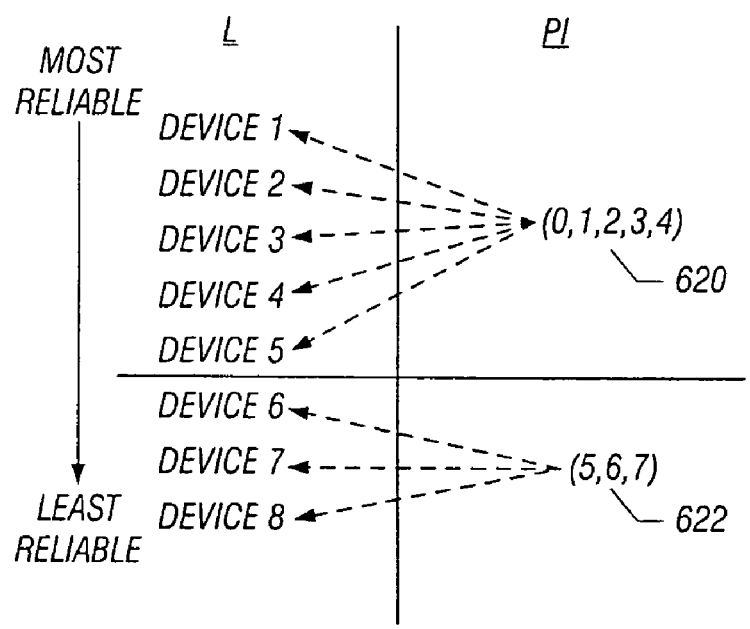
FIG. 8 illustrates allocation of the partially ordered symbols of FIG. 7 across a plurality of devices having heterogeneous failure rates, in accordance with an embodiment of the invention.

Any order O congruent with partial order P1 may then be used to place the symbols on devices of the system 100. For instance, as shown in FIG. 8, a list L which lists the devices from most reliable to least reliable can be used in conjunction with the partial order P1 to allocate the symbols across the devices. Because symbols (0, 1, 2, 3, 4) have all been accorded the same precedence in order P1, any one of them may be placed on the five most reliable devices in the system 100 (i.e., devices 1-5). Symbols (5, 6, 7) may then be allocated in any order across the three least reliable devices (i.e., devices 6-8) in the system 100.

In some embodiments, it may be desirable to further enhance the ordering induced by the MEMW 500 technique. Thus, in accordance with one embodiment, histograms may be used in conjunction with the MEMW technique to induce a partial ordering P2 on the symbols of the erasure code. The histogram is used to count the number of same size MEMWs in which each symbol in a partially order set of symbols participates. Symbols that participate in a greater number of same size MEMWs are accorded a higher precedence in the ordering, because these symbols will have a greater influence on reliability.

Figure 7:
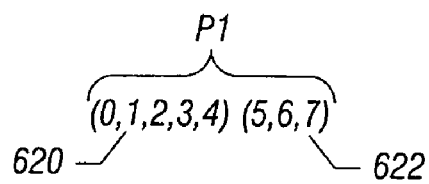
FIG. 7 is a partial ordering of the symbols of the erasure code represented in FIG. 6, using the technique illustrated in FIG. 5.

Thus, for instance, returning to the MEL 600 of FIG. 6, and the partial order P1 shown in FIG. 7, further ordering of each of the sets 620 and 622 may be accomplished through the use of histograms which count the number of erasure patterns in which each symbol in each set participates. The histogram for each set of symbols may be expressed as a list of "$s_i$:count" where "$s_i$" represents the particular symbol in the set, and "count" represents the number of erasure patterns in which with symbol $s_i$ participates.

Figure 9:
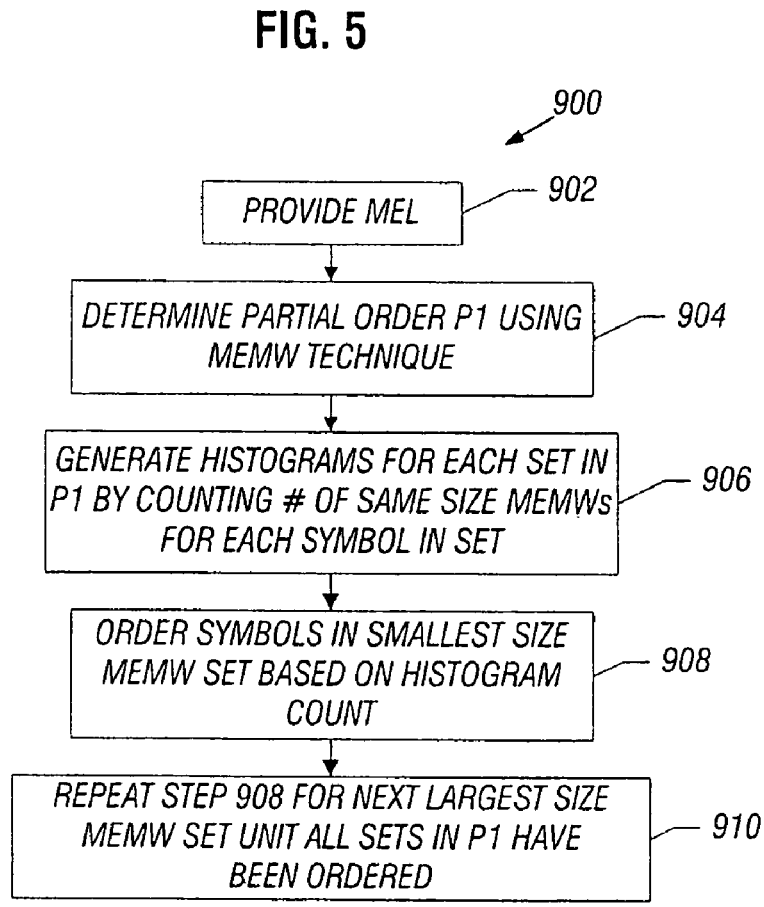
FIG. 9 is a flow diagram of a minimal erasures of minimal weight technique employing histograms to induce an ordering on symbols of an erasure code, in accordance with an exemplary embodiment of the invention.

A flow diagram representing an MEMW with histograms technique 900 is shown in FIG. 9. Again, an MEL of an erasure code is provided (block 902), and the partial order P1 is generated using the MEMW technique 500 (block 904). Next, histograms corresponding to each of the sets 620 and 622 of partial order P1 are generated (block 906).

To illustrate the generation of histograms with the technique 900, first consider set 620 of partial order P1, which contains the symbols which appear in the size two MEMWs. In set 620, the symbol "2" appears in two MEMWs 602 and 604, while symbols "0," "1," "3," and "4" each appear in only one MEMW (i.e., MEMWs 602, 604, 606, and 606, respectively). Thus, the histogram corresponding to set 620 of MEMWs may be expressed as: [0:1, 1:1, 2:2, 3:1, 4:1]. With respect to set 622 which contains the symbols that appear in MEMWs of size three (i.e., symbols "5," "6," and "7"), symbols "6" and "7" both appear in three size three MEMWs (i.e., MEMWs 608, 614, 616; and MEMWs 612, 614, 616, respectively), while symbol "5" appears in only two size three MEMWs 610 and 616). Thus, the histogram corresponding to set 622 may be expressed as: [5:2, 6:3, 7:3].

Figure 10:
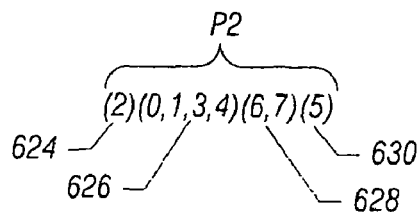
FIG. 10 is a partial ordering of symbols induced using the technique of FIG. 9, in accordance with an exemplary embodiment of the invention.

Using the histograms, the symbols for the erasure codes may then be ordered starting with the set of symbols for the smallest size MEMWs (i.e., set 620) (block 908). Based on the histogram corresponding to set 620, it can be seen that the symbol "2" should be accorded a higher precedence relative to the remaining symbols in set 620 since its count is "2." The remaining symbols in set 620 have the same precedence and thus may be placed in any order after symbol "2." After the symbols in set 620 are ordered, the symbols in the next largest size MEMW set are ordered based on the histogram count for that set (block 910). For instance, based on the histogram for set 622, it can be seen that symbols "6" and "7" have the same precedence which is higher than the precedence of symbol "5." Thus, symbols "6" and "7" may be placed in any order after symbols "0-4," and symbol "5" should be placed last in the order. These steps repeat until the symbols in all sets in the partial order P1 have been ordered. Accordingly, the MEMW with histograms technique 900, which counts the number of same size MEMWs for each symbol, yields the partial order P2 illustrated in FIG. 10 for MEL 600, in which four sets 624, 626, 628 and 630 represent the partially ordered symbols of the erasure code.

Figure 11:
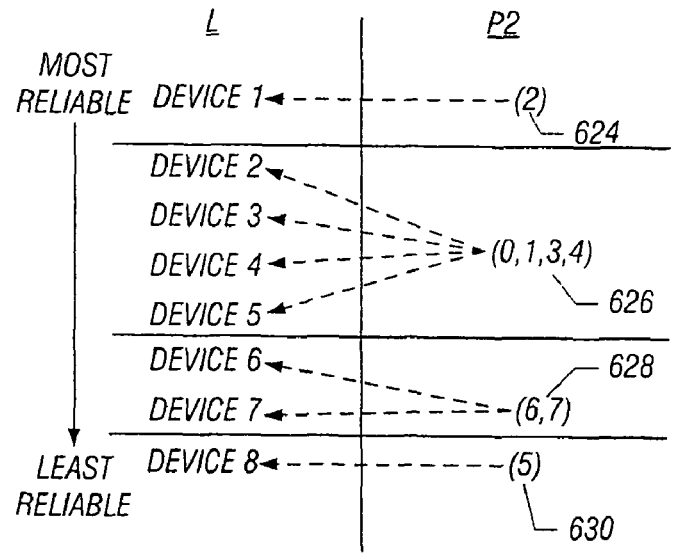
FIG. 11 illustrates an allocation of the partially ordered symbols of FIG. 10 across a plurality of devices that have heterogeneous failure rates, in accordance with an exemplary embodiment of the invention.

Again, any order O that is congruent with partial order P2 may be used to place the symbols across the devices of system 100. For instance, with reference to FIG. 11, given list L which orders the devices in system 100 from most reliable to least reliable, symbol "2" will be placed on the most reliable device 1; symbols "0," "1," "3," and "4" may be placed on any order on any of the next four devices 2-5; symbols "6" and "7" may be placed in any order on the sixth and seventh most reliable devices 6 and 7; and symbol "5" will be placed on the least reliable device 8 since symbol "5" has the least influence on system reliability.

Figure 12:
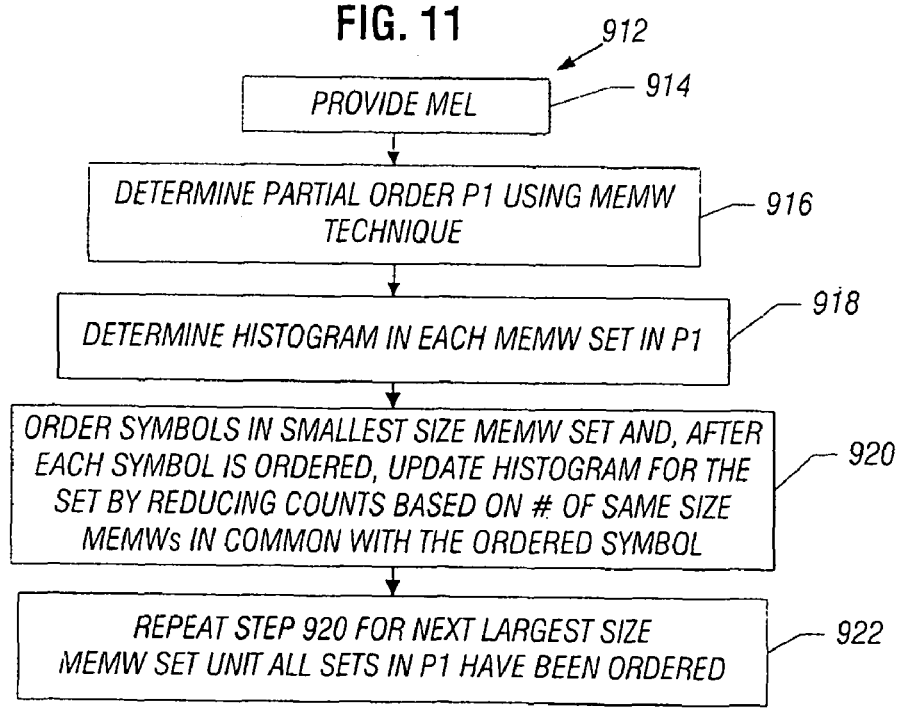
FIG. 12 is a flow diagram of a minimal erasures of minimal weight technique using dependencies to induce an ordering on symbols of an erasure code, in accordance with an exemplary embodiment of the invention.

In some embodiments, it may be desirable to induce a total order O on the symbols in the erasure code. Thus, for instance, again returning to the MEL 600 of FIG. 6 and the partial order P1 shown in FIG. 7, the symbols within each of sets 620 and 622 may be totally ordered based on further considerations. One such consideration that can lead to a total order is based on the recognition that once a symbol $s_i$ within a particular set has been allocated to a device within system 100, then the importance of allocating other symbols that share same size MEMWs with the allocated symbol $s_i$ is reduced in accordance with the number of same size MEMWs in common with symbol $s_i$. In other words, this ordering scheme (which is referred to as an MEMW with dependencies technique 912, as illustrated in FIG. 12), takes into account the dependencies each symbol in a set has on the precedence that has been accorded an ordered symbol in the set.

Referring to FIG. 12, the technique 912 again starts with an MEL for the erasure code (block 914), the partial order P1 is generated using the MEMW technique 500 (block 916), and histograms for each set in P1 are generated which count the number of same size MEMWs in which each symbol participates (block 918). Next, according to the technique 912, symbols in the smallest size MEMW set (i.e., set 620) are ordered first based on the histogram counts. However, after each symbol in the set is ordered, the histogram for that set is updated by reducing the counts of the remaining symbols based on the number of same size MEMWs that each symbol has in common with the ordered symbol (block 920).

The reduction of a symbol's count in the histogram is performed by either reducing the count by a constant amount or by a predefined function. For instance, in some embodiments, the symbol's count in the histogram may simply be reduced by "1" for each same size MEMW that the symbol has in common with an ordered symbol from the set. Alternatively, and as an example, a function such as "k+m-precedence(s)" may be used to reduce the count, where "k" represents the number of symbols in the erasure code; "m" represents the number of redundant (or parity) symbols in the erasure code; and "precedence(s)" represents the precedence of symbol $s_i$ in the ordering scheme. For example, for an erasure code having k=8, the highest precedence symbol has a precedence of "1" (indicating that it is first in the order) while the lowest precedence symbol has a precedence of "8" (indicating that it is the last symbol in the order). The ordering of the next symbol in the set is then based on the updated histogram counts for that set. The ordering of each symbol within a set, updating of histogram counts for the set, and further ordering of the remaining symbols in the set repeats for each next largest size MEMW set until a total order results (block 922).

An exemplary result of this total ordering approach, order O1, is illustrated in FIG. 13. In this example, once a symbol $s_i$ is ordered, the histogram count of each symbol remaining in the set is reduced by the number of minimal erasures that the remaining symbol has in common with ordered symbol $s_i$. To illustrate, as set forth above, the histogram corresponding to set 620 is: [0:1, 1:1, 2:2, 3:1, 4:1]. Because symbol "2" has the highest count, it is accorded the highest precedence in the total order O1 and is ordered first. The histogram for set 620 is then updated as follows: [0:0, 1:0, 3:1, 4:1]. The count for symbol "6" has been reduced by "1" because symbol "0" shares one size two MEMW 602 with symbol "2." Likewise, the count for symbol "1" is reduced by "1" because symbol "1" shares a single size two MEMW 604 with symbol "2." The counts for symbols "3" and "4" are not reduced because those symbols do not appear in any size two MEMWs along with symbol "2."

The remaining symbols in set 620 are then ordered in accordance with the updated histogram. From the histogram, it can be seen that symbols "3" and "4" both have the same weight. Thus, absent further considerations as to ordering, either of symbols "3" and "4" may be placed next in the total order O1. If symbol "3" is arbitrarily selected for ordering, then the histogram is updated as follows: [0:0, 1:0, 4:0]. The counts for symbols "0" and "1" are unchanged since "0" and "1" do not participate in any MEMWs of size two with symbol "3." The count for symbol "4" is reduced by "1" since symbol "4" appears in MEMW 606 with symbol "3."

At this point, all remaining symbols in set 620 have the same precedence. Accordingly, any symbol may be arbitrarily selected as the next symbol in the order. If symbol "0" is selected, then the histogram for set 620 is updated as follows: [1:0, 4:0]. The counts for the remaining symbols are unchanged since those symbols do not participate in any MEMWs of size two with symbol "0." Again, because the remaining symbols have the same count, either one of the symbols may be placed next in the order. In the total order O1 shown in FIG. 13, symbol "1" is placed first and symbol "4" is placed next, thus producing a total order of set 620.

The next largest size MEMW set 622 in the partial order P1 is then ordered in similar manner. The histogram for set 622 starts as: [5:2, 6:3, 7:3]. Since symbols "6" and "7" have the same weight, either symbol may be placed next in the order O1. If symbol "6" is selected, then the histogram for set 622 is updated as follows: [5:1, 7:1]. The count for symbol "5" is reduced by "1" because symbol "5" shares a single size three MEMW 616 with symbol "6." The count for symbol "7" is reduced by "2" because symbol "7" shares two size three MEMWs 614 and 616 with symbol "6." At this point, since the remaining symbols now have the same precedence, either may be selected next for placement in the order O1 632. If symbol "5" is selected and then symbol "7" is selected, then the total order O1 shown in FIG. 13 results. The symbols may then be allocated to the devices of system 100 as defined by total order O1 and list L, as illustrated in FIG. 14. Specifically, the symbol "2" which has the most influence on system reliability is allocated to the most reliable device in list L (i.e., device 1), and so forth, ending with the allocation of symbol "7" which has the least influence on system reliability to the least reliable device (i.e., device 8) in list L.

In another embodiment, a different total order O2 may be imposed on the symbols of the erasure code by not only updating the histogram for the set that is currently being ordered, but also updating the histograms corresponding to larger size MEMWs. This ordering scheme, which is referred to as an MEMW with back dependencies technique 926 (see FIG. 15), thus extends the dependencies of already ordered symbols to sets within the partial order corresponding to larger MEMWs. Again, the histogram count may be updated either by a constant amount or by a predefined function.

Figure 15:
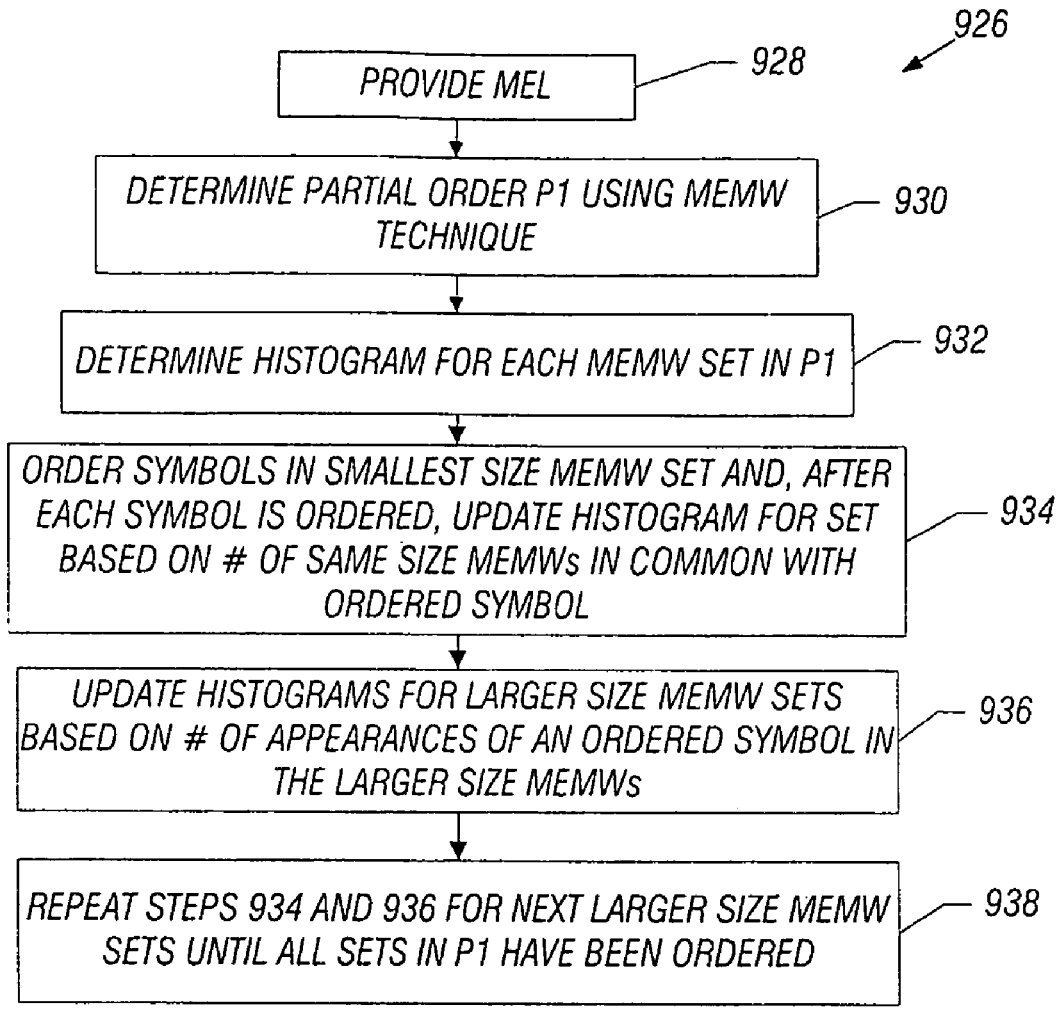
FIG. 15 is a flow diagram of a minimal erasures of minimal weight technique using backward dependencies to induce an ordering on symbols of an erasure code, in accordance with an exemplary embodiment of the invention.

For instance, with reference to the flow diagram of FIG. 15 which illustrates the technique 926, an MEL is provided for the erasure code (block 928), a partial order P1 is generated in accordance with the MEMW technique 500 (block 930), and histograms corresponding to each of the sets 620 and 622 within partial order P1 are generated (block 932). Starting with the smallest size MEMW set 620 in the partial order P1, the symbols are ordered based on updating histogram counts for set 620 after each symbol in the set 620 is ordered (block 934). However, in accordance with technique 926, the histogram(s) corresponding to the larger size MEMW set(s) 622 are updated at the same time (block 936). More specifically, the counts of the symbols in the histogram corresponding to the size three MEMW set 622 are reduced based on whether a symbol in set 622 has a size three MEMW in which an ordered symbol from set 620 also appears.

To illustrate this technique, the original histogram for set 622 was: [5:2, 6:3, 7:3]. However, in accordance with the technique 926, the ordering of set 620 also results in an updated histogram for set 622 as follows: [5:0, 6:0, 7:0]. The count for symbol "5" has been reduced by "2" since two previously ordered symbols "2" and "4" also appear with symbol "5" in the size three minimal erasure 610. The count for symbol "6" has been reduced by "3" since symbol "6" appears in erasure 608 with ordered symbols "1" and "4" (thereby reducing the count by "2") and in erasure 614 with ordered symbol "3" (thereby reducing the count by another "1" for a total reduction of "3"). Similarly, the count for symbol "7" is reduced by "3" since the symbol "7" appears in erasure 612 with ordered symbols "0" and "1" (thereby reducing the count by "2") and in erasure 614 with ordered symbol "3" (thereby reducing the count by another "1").

At this point, all of the symbols in set 622 have the same precedence. Accordingly, any one of the symbols may be placed next in the order O2. As with set 620, the histogram for set 622 again is updated each time a symbol within the set is placed in the order (block 938). Thus, if symbol "5" is placed, then the histogram for set 622 is updated to: [6:−1, 7:−1], since symbols "6" and "7" both appear in erasure 616 with symbol "5." Again, the remaining symbols have equal precedence, such that either one may be placed next in the order. If symbol "6" is selected, then the total order O2 shown in FIG. 16 results. The various symbols may then be allocated to the devices in list L according to the order O2, as shown in FIG. 17.

The techniques described above may be combined in various manners to produce different total orders. For instance, yet one other total ordering scheme may induce a total order O3 that ensures that the number of minimal erasures of minimal weights in which a symbol is a member is the dominant factor in ordering the symbol, while also taking into account the dependencies the remaining symbols have on symbols that already have been ordered. This ordering scheme is a combination of the MEMW with histograms technique 900 and the MEMW with dependencies technique 912.

According to this combination of techniques, a total order O3 is induced based on the sets of symbols of the partial order P2 produced by the MEMW with histograms technique 900 and the histograms produced by the MEMW with dependencies technique 912. The partial order P2 contains sets 624 (2), 626 (0, 1, 3, 4), 628 (6, 7) and 630 (5). Since symbol "2" is the only symbol in set 624, symbol "2" is placed first in total order O3. To induce an order on the symbols in set 626, the histogram for set 626 that was produced when using the MEMW with dependencies technique 912 is then considered. As set forth above, this histogram is: [0:1, 1:1, 3:1, 4:1]. Since all symbols have the same precedence, any symbol may be selected as the next symbol in the order O3. For instance, symbol "0" may be selected, then symbol "1," followed by symbol "3" and followed finally by symbol "4." The histogram for set 628 that resulted from the MEMW with dependencies technique 912 is then examined: [6:3, 7:3]. Since all symbols again have the same precedence, they may be arbitrarily placed in the total order O3. For instance, symbol "6" may be selected and then symbol "7." Finally, the histogram for set 630 which was produced from the MEMW with dependencies technique 912 is examined. Since symbol "5" is the only symbol remaining, it is placed last in the order O3, as shown in FIG. 18. The symbols may then be allocated across the devices in list L in the order of their precedence in order O3, as shown in FIG. 19.

Another combination of ordering schemes is the MEMW with histograms and backward dependencies technique. This combination takes as inputs the sets of the partial order P2 induced by the MEMW with histograms technique 900 and the histograms produced generated using the MEMW with backward dependencies technique 926 to produce a total order O4. Again, partial order P2 contains symbol sets 624 (2), 626 (0, 1, 3, 4), 628 (6, 7) and 630 (5). Starting with set 624, symbol "2" again is ordered first since it is the only symbol in the set. Then, the histogram for set 626 from the MEMW with backward dependencies technique 926 is examined, which is: [0:0, 1:0, 3:1, 4:1]. Since symbols "3" and "4" have the same precedence, either of them may be placed in total order O4. Thus, for instance, symbol "3" may be placed first, followed by symbol "4." The remaining symbols in set 626 also have the same precedence in the histogram, and thus also may be arbitrarily placed next in total order O4. For instance, symbol "0" first may be selected, followed by symbol "1." Next, the histogram for set 628 from the MEMW with backward dependencies technique 926 is examined: [6:0, 7:0]. Once again, the symbols have the same precedence and may be arbitrarily placed in the order O4 by, for instance, first selecting symbol "6" and then placing symbol "7." The remaining symbol "5" in set 630 is then placed in the order O4 shown in FIG. 20, and the symbols may be allocated to the devices in list L accordingly, as shown in FIG. 21.

The examples thus far have reduced histogram counts by a constant amount. However, the counts also may be reduced as a function of the number of minimal erasures shared in common, potentially across minimal erasures of different sizes. Alternatively, the histogram counts may be reduced as a function of the precedence assigned to a placed symbol $s_i$. In such a case, the first placed symbol will reduce counts for symbols it has minimal erasures in common with at a higher rate than the next ordered symbol.

To illustrate a total ordering scheme based on the precedence of previously ordered symbols, consider the MEMW with histograms and backward dependencies that reduces histogram counts by a function of "k–1-precedence", where "k" represents the number of symbols in the erasure code and "precedence" represents a placed symbol's precedence in the total order thus far. For instance, the first symbol in the order has a precedence of "1," while the last symbol in the order has a precedence of "k." Starting again with the partial order P2 induced by the MEMW with histograms technique 900, sets 624, 626, 628 and 630 will be ordered. Since symbol "2" is the only symbol in set 624, it is placed first in the order. The starting histogram for set 626 is: [0:1, 1:1, 3:1, 4:1]. The counts for each symbol in set 626 are then reduced according to the function "7-precedence of symbol "2"." Since the precedence for symbol "2" is "1," the updated histogram is: [0:–5, 1:–5, 3:1, 4:1]. The counts for symbols "0" and "1" are reduced because they each share a minimal erasure of size two (i.e., erasures 602 and 604, respectively) with symbol "2." Because symbols "3" and "4" do not participate in any size two minimal erasures with symbol "2," their count is not reduced.

Based on the updated histogram, symbols "3" and "4" have the same precedence and either one may be placed next in the total order O5. If symbol "3" is selected, then the precedence of symbol "3" is "2", and the histogram for set 626 is updated as follows: [0:–5, 1:–5, 4:–4]. The count for symbols "0" and "1" are unchanged since they do not have a size two minimal erasure in common with symbol "3." Because symbol "4" shares one size two minimal erasure with symbol "3" (i.e., erasure 606), the count for symbol "4" is reduced according to the function "7-precedence of symbol "3"," where the precedence of symbol "3" is "2."

Since symbol "4" now has the highest precedence in set 626, symbol "4" is placed next in order O5. The histogram for set 626 is again updated to: [0:–5, 1:–5]. Here, the counts for symbols "0" and "1" are unchanged because they do not have any size two minimal erasures in common with symbol "4."

Further, since symbols "0" and "1" have the same count, either may be placed next in order O5. For instance, symbol "0" may first be selected and then symbol "1."

The histogram for set 628 is then considered. The original histogram for set 628 was: [6:3, 7:3]. However, because of backward dependencies, the counts for symbols "6" and "7" have been reduced by the precedence of the ordered symbols which participate in a minimal erasure of size three along with symbols "6" and "7." With respect to symbol "6," it does not share any size three minimal erasures with symbol "2" (having a precedence of "1" for a count reduction of "6"); it shares one size three minimal erasure 614 with symbol "3" (which has a precedence of "2" for a count reduction of "5"); it shares on size three minimal erasure 608 with symbol "4" (which has a precedence of "3" for a count reduction of "4"); it shares no size three minimal erasures with symbol "0" (which has a precedence of "4" for a count reduction of "3"); and it shares one size three minimal erasure 608 with symbol "1" (which as a precedence of "5" for a count reduction of "2"). Thus, the count for symbol "6" is reduced to "–8" as follows: 3 (original count) –5 (count reduction of symbol "3") –4 (count reduction of symbol "4") –2 (count reduction of symbol "1").

The count for symbol "7" is reduced in a similar manner to "–7" as follows: 3 (original count for symbol "7") –5 (reduction of symbol "3") –3 (reduction of symbol "0") –2 (reduction of symbol "1"). Thus, the updated histogram for set 628 becomes: [6:–8, 7:–7]. Since symbol "7" has the highest precedence, it is placed next in the order O5, followed by symbol "6." The remaining symbol "5" in set 630 is then placed last in the order. Again, the symbols may then be allocated across the devices in list L in accordance with the total order O5 shown in FIG. 22, in the manner shown in FIG. 23.

Figure 24:
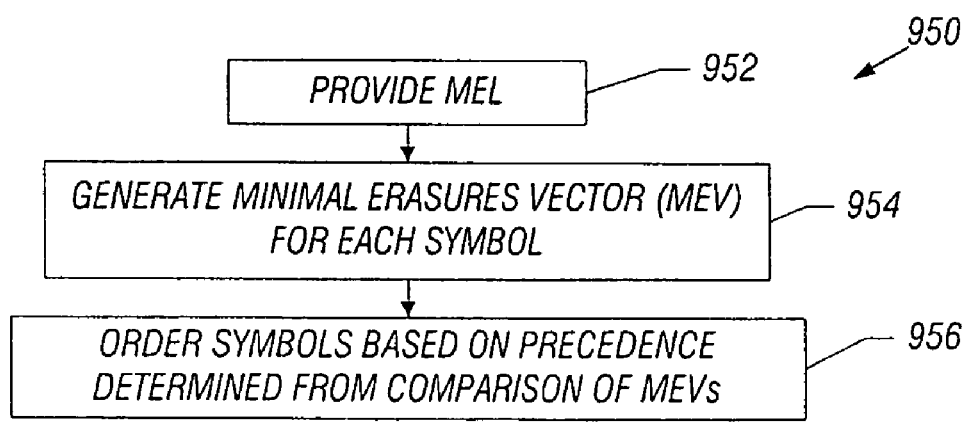
FIG. 24 is a flow diagram of an ordering scheme based on minimal erasure vectors for each symbol in an erasure code, according to an exemplary embodiment of the invention.

In other embodiments of the invention, ordering of the symbols may be based on the minimal erasures vectors (MEVs) for each symbol of a given erasure code rather than the MEMWs. Such an ordering technique 950 is illustrated in the flow diagram of FIG. 24. As with the other ordering techniques, technique 950 starts with a list of erasure patterns for an erasure code (block 952). An MEV for each symbol is then generated based on the list of erasure patterns (block 954). The symbols of the erasure code may then be ordered by precedence based on a comparison of the MEVs for the symbols (block 956).

To illustrate an example of the implementation of technique 950, the MEL 600 shown in FIG. 6 has a MEV that may be expressed as (0, 3, 5), indicating that the MEL has no erasure patterns of size one, three erasure patterns of size two, and five erasure patterns of size three. MEVs for each symbol may be generated in a similar manner. For instance, the MEV of symbol "0" may be expressed as (0, 1, 1), indicating that the symbol "0" does not participate in any erasure patterns of size one, but does participate in one erasure pattern of size two (i.e., pattern 602) and one erasure pattern of size three (i.e., pattern 612). The MEVs for each of the other symbols may be expressed similarly, such that the MEV for symbol "1" is (0, 1, 2); the MEV for symbol "2" is (0, 2, 1); the MEV for symbol "3" is (0, 1, 1); the MEV for symbol "4" is (0, 1, 2); the MEV for symbol "5" is (0, 0, 2); the MEV for symbol "6" is (0, 0, 3); and the MEV for symbol "7" is (0, 0, 3).

In such an embodiment, instead of basing ordering on minimal erasures of minimal weight, ordering may be based on the "worst" MEV for a symbol. The "worst" MEV is the MEV that indicates that the symbol occurs in either the shortest length erasure pattern of the greatest number or erasure patterns of the shortest length. Thus, for the example provided herein, the MEV for symbol "2" is the "worst" MEV because it indicates that symbol "2" occurs in two erasure patterns of size two, while all of the other symbols' MEVs indicate that the symbol occurs in either no or one erasure pattern of size two. Accordingly, symbol "2" is placed first in a partial order P3, as illustrated in FIG. 25.

Further comparison of the MEVs for each symbol reveal that the MEVs for symbols "1" and "4" are the next "worst" MEVs; the MEVs for symbols "0" and "3" follow symbols "1" and "4"; the MEVs for symbols "6" and "7" follow symbols "0" and "3"; and the MEV for symbol "5" is the best MEV. This comparison results in the partial order P3 shown in FIG. 25. In some embodiments, a total order may then be induced by using the MEL to apply dependency (or backward dependency) penalties to the MEV for each symbol. Use of MEVs for each symbol to order the symbols may provide the ability to incorporate information about minimal erasures with weights larger than the minimal erasure of minimal weight for a given symbol of the erasure code.

Although the ordering schemes set forth herein have been described with respect to their use with a minimal erasures list, it should be understood that the ordering schemes also may be used with a complete list of erasure patterns (i.e., an EL) or with a list of composite erasure patterns (i.e., a CEL). However, generally, use of the MEL should produce an ordering in a more computationally efficient manner than either the EL or CEL. Similarly, in embodiments which induce an ordering based on erasure vectors, schemes may also be used with an EV based on the erasure patterns in an EL or a CEV based on the erasure patterns in a CEL.

Further variations of the ordering schemes also are contemplated. For instance, the ordering schemes may also take into account the failure rates of each of the devices in system 100 to further influence the precedence accorded to each symbol placed in the order. In addition, the ordering schemes may be implemented in an online system that adapts the failure rates of the devices in the system 100 based on actual performance, updates the list L of devices accordingly, and then updates the allocation of the various symbols of the erasure code across the devices. The ordering schemes also may be coupled with a hill climbing algorithm to maximize the reliability of many erasure coded files over a plurality of storage devices. For instance, the hill climbing algorithm could be used to swap the set of devices currently storing particular files. One of the ordering schemes described above then could be run after each swap to maximize the reliability of the stored files given the new set of devices used to store the files.

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs). Note that the instructions of the software discussed above can be provided on one computer-readable or computer-usable storage medium, or alternatively, can be provided on multiple computer-readable or computer-usable storage media distributed in a large system having possibly plural nodes. Such computer-readable or computer-usable storage medium or media is (are) considered to be part of an article (or article of manufacture). An article or article of manufacture can refer to any manufactured single component or multiple components.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method of determining an allocation of symbols of an erasure code across a plurality of devices, comprising:
   providing a list of erasure patterns for an erasure code, the erasure code having a plurality of symbols;
   based on the list, identifying a minimal erasure of minimal weight (MEMW) for each symbol;
   determining precedences of the symbols of the erasure code based on sizes of the corresponding MEMWs for the symbols; and
   determining an allocation of the symbols across a plurality of devices based on the determined precedences.

2. The method as recited in claim 1, further comprising:
   allocating the symbols across the plurality of devices based on the allocation, wherein the plurality of devices have corresponding failure rates, and wherein a symbol having a highest precedence in the ordering is allocated to a device having a lowest failure rate.

3. The method as recited in claim 2, wherein the devices include at least one device from a group of storage devices and communication devices.

4. The method as recited in claim 2, wherein a symbol has the highest precedence if the symbol has a smallest size MEMW.

5. The method as recited in claim 1, further comprising:
   grouping the symbols in sets, wherein the symbols in a set have a same size MEMW; and
   ordering the symbols within each of the sets based on a quantity of same size MEMWs for each symbol, wherein a symbol having a greatest quantity of same size MEMWs is accorded a highest precedence in the set.

6. The method as recited in claim 1, further comprising:
   grouping the symbols in sets, wherein the symbols in a set have a same size MEMW;
   generating histograms for the sets of symbols, wherein the histogram identifies a count of same size MEMWs for the symbols in the corresponding set;
   ordering a first symbol in a first set of symbols based on the count; and
   adjusting the count for each remaining symbol in the first set based on the ordering of the first symbol in the first set.

7. The method as recited in claim 6, wherein the count for each remaining symbol is adjusted based on whether the remaining symbol appears in a same size MEMW along with the first symbol.

8. The method as recited in claim 6, further comprising updating the histogram for a second set of symbols based on the ordering of the first symbol in the first set.

9. A method of determining an allocation of a plurality of symbols of an erasure code, comprising:
   providing a list of erasure patterns for an erasure code, the erasure code having a plurality of symbols;

based on the list of erasure patterns, generating an erasure vector for each symbol of the erasure code;

determining a precedence of each symbol based on the erasure vectors for the symbols; and determining an allocation of the symbols of the erasure code across a plurality of devices based on the determined precedences.

10. The method as recited in claim 9, wherein the plurality of devices include at least one device from a group of storage devices and communication devices.

11. The method as recited in claim 9, wherein the plurality of devices have corresponding failure rates, and wherein a symbol having a highest precedence is allocated to a device having a lowest failure rate of the corresponding failure rates.

12. The method as recited in claim 9, wherein the list of erasure patterns is a list of minimal erasure patterns, and wherein a symbol has a highest precedence in the ordering if the symbol appears in a smallest size minimal erasure pattern.

13. The method as recited in claim 9, wherein the list of erasure patterns is a list of minimal erasure patterns, and wherein a symbol has a highest precedence in the ordering if the symbol appears in a largest number of smallest size minimal erasure patterns.

14. An article comprising at least one computer-readable storage medium containing instructions that when executed cause a processor-based system to:

generate a list of erasure patterns corresponding to an erasure code having a plurality of symbols;

based on the list, identify minimal erasures of minimal weight (MEMWs) corresponding to the symbols;

determine precedences of the symbols of the erasure code based on sizes of the corresponding MEMW for the symbols;

order the symbols of the erasure code based on the determined precedences; and determine an allocation of the symbols across a plurality of devices based on the order.

15. The article as recited in claim 14, wherein the plurality of devices include at least one from a group of storage devices and communication devices.

* * * * *